United States Patent
Do et al.

(10) Patent No.: US 7,585,750 B2
(45) Date of Patent: Sep. 8, 2009

(54) SEMICONDUCTOR PACKAGE HAVING THROUGH-HOLE VIA ON SAW STREETS FORMED WITH PARTIAL SAW

(75) Inventors: Byung Tai Do, Singapore (SG); Heap Hoe Kuan, Singapore (SG); Linda Pei Ee Chua, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 11/861,233

(22) Filed: Sep. 25, 2007

(65) Prior Publication Data
US 2008/0274603 A1    Nov. 6, 2008

Related U.S. Application Data

(63) Continuation-in-part of application No. 11/768,844, filed on Jun. 26, 2007.

(51) Int. Cl.
  *H01L 21/30* (2006.01)
(52) U.S. Cl. .................. 438/462; 257/E21.211
(58) Field of Classification Search ............ 438/462; 257/E21.211
  See application file for complete search history.

(56) References Cited

U.S. PATENT DOCUMENTS

| | | |
|---|---|---|
| 5,694,551 A | 12/1997 | Doyle et al. |
| 6,157,915 A | 12/2000 | Bhaskaran et al. |
| 6,743,696 B2 | 6/2004 | Jeung et al. |
| 2002/0013721 A1 | 1/2002 | Dabbiere et al. |
| 2002/0019761 A1 | 2/2002 | Lidow |
| 2002/0042755 A1 | 4/2002 | Kumar et al. |
| 2002/0049622 A1 | 4/2002 | Lettich et al. |
| 2003/0022465 A1* | 1/2003 | Wachtler .................... 438/462 |
| 2008/0211113 A1* | 9/2008 | Chua et al. .................. 257/782 |

FOREIGN PATENT DOCUMENTS

| | | | |
|---|---|---|---|
| KR | 10-1999-0054459 | * | 12/1999 |
| KR | 10-1999-0054459 | * | 10/2000 |

* cited by examiner

*Primary Examiner*—Matthew Smith
*Assistant Examiner*—Walter H Swanson
(74) *Attorney, Agent, or Firm*—Robert D. Atkins

(57) ABSTRACT

A method of forming through-hole vias in a semiconductor wafer involves forming a semiconductor wafer with many die having contact pads disposed on each die. The semiconductor wafer has saw street guides between each die. A trench is formed in the saw streets. The trench extends partially but not completely through the wafer. The uncut portion of the saw street guides below the trench along a backside of the wafer maintains structural support for the semiconductor wafer. The trench is filled with organic material. Via holes are formed in the organic material. Traces are formed between the contact pads and via holes. Conductive material is deposited in the via holes to form metal vias. The uncut portion of the saw streets below the trench along the backside of the semiconductor wafer portion is removed. The semiconductor wafer is singulated along the saw street guides to separate the die.

26 Claims, 17 Drawing Sheets

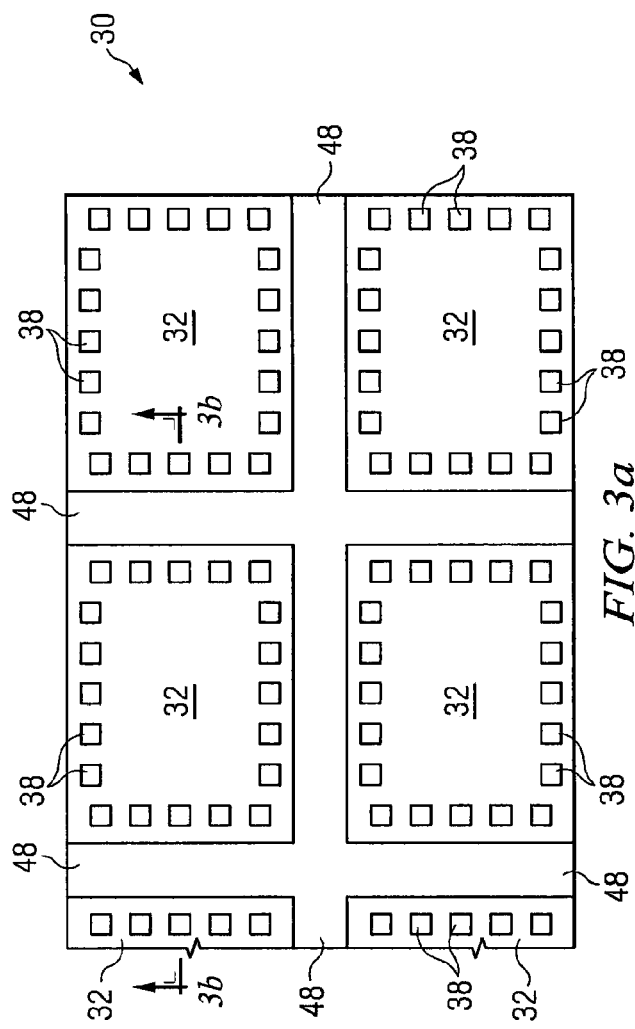
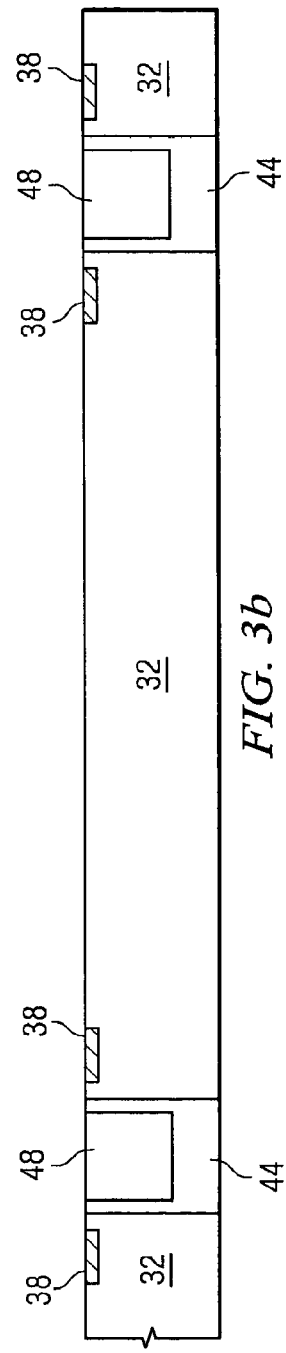
FIG. 3a
FIG. 3b

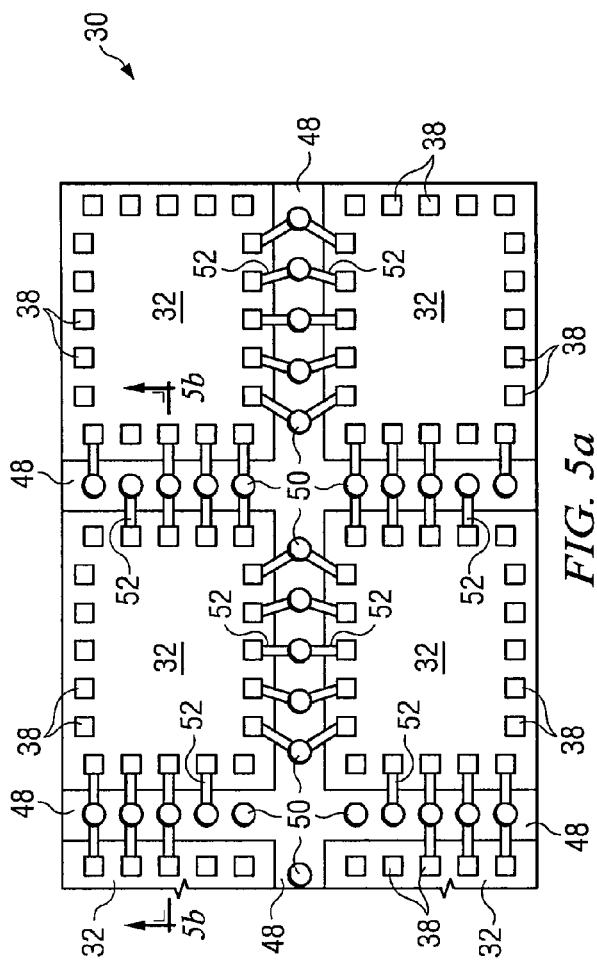
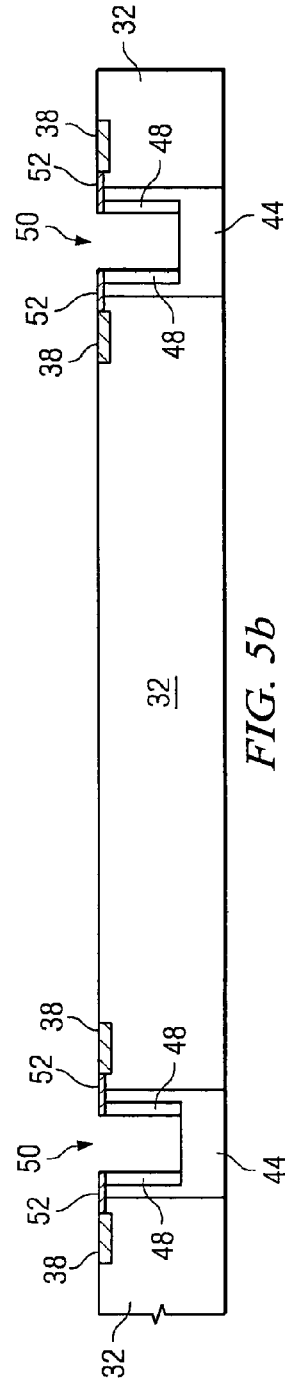

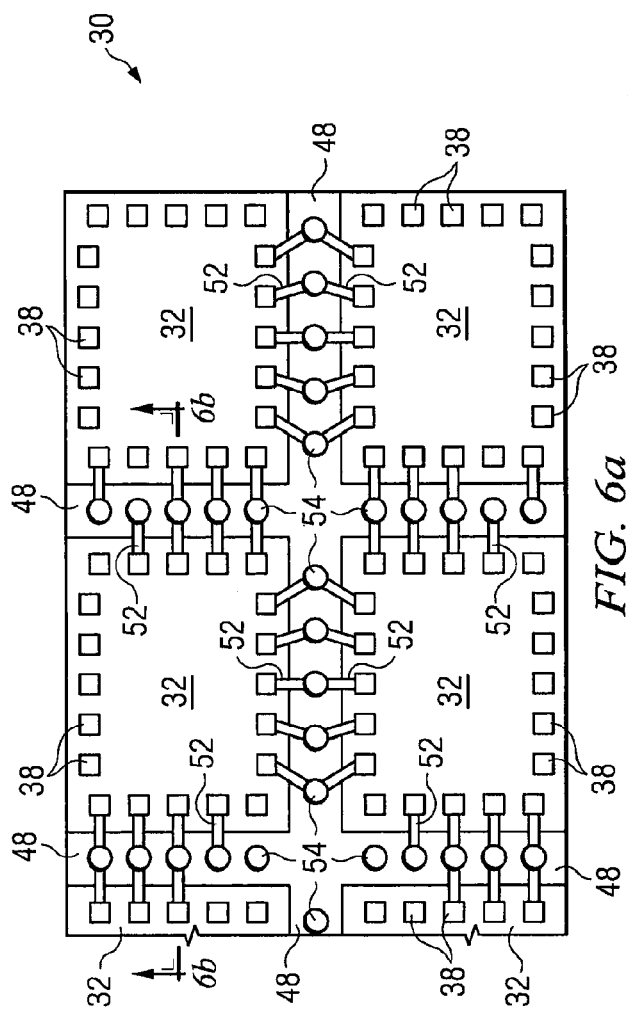
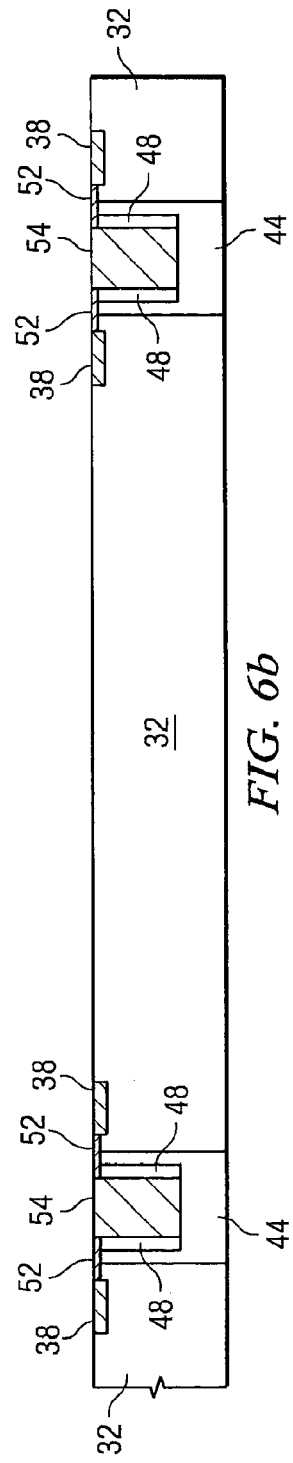
FIG. 6a
FIG. 6b

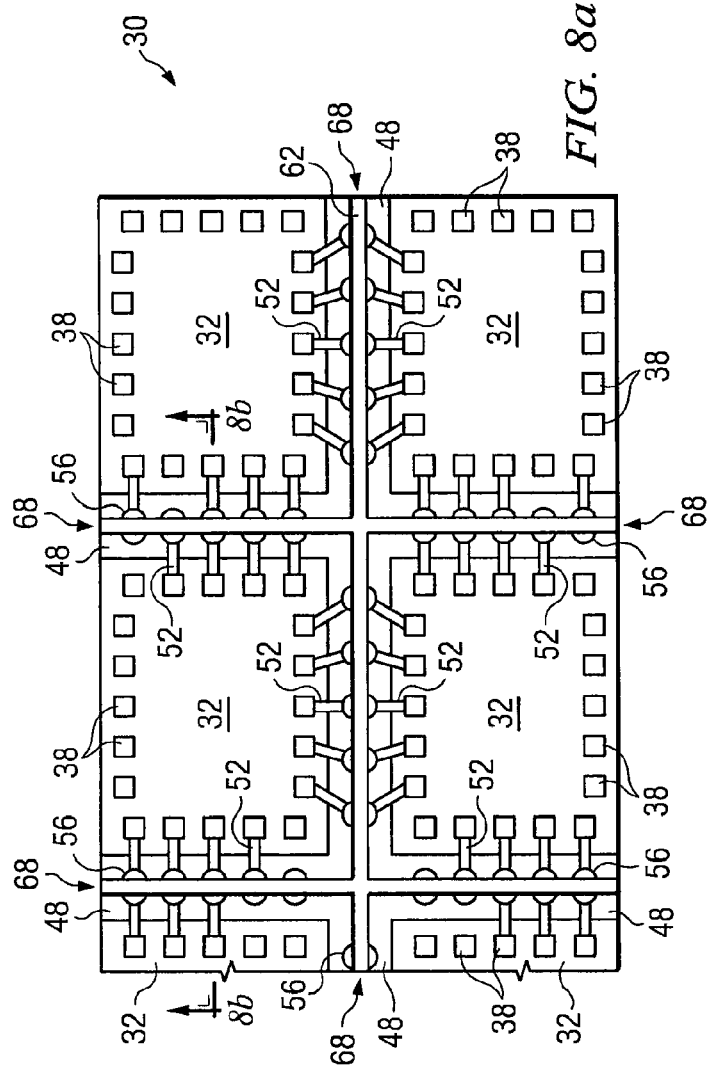
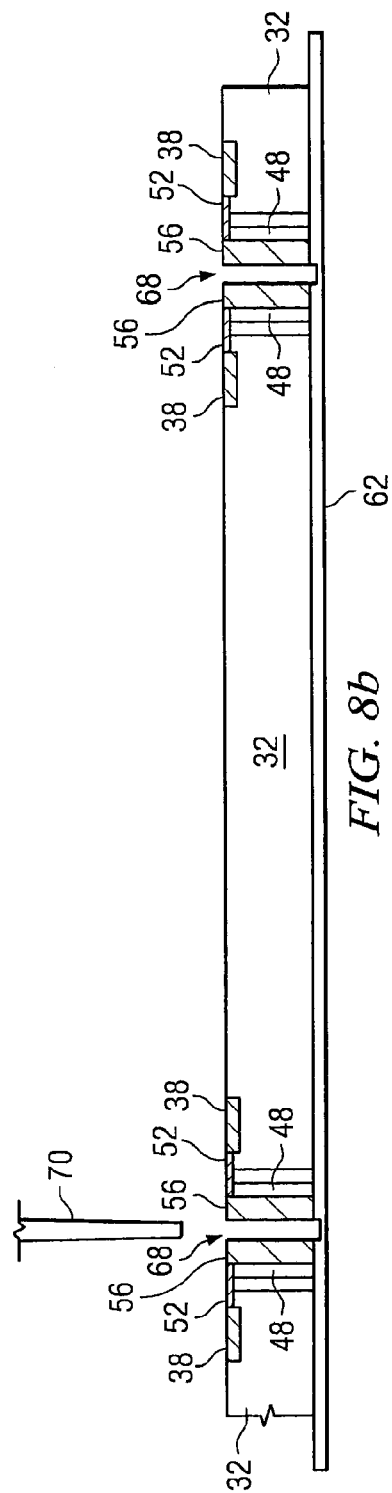
FIG. 8a
FIG. 8b

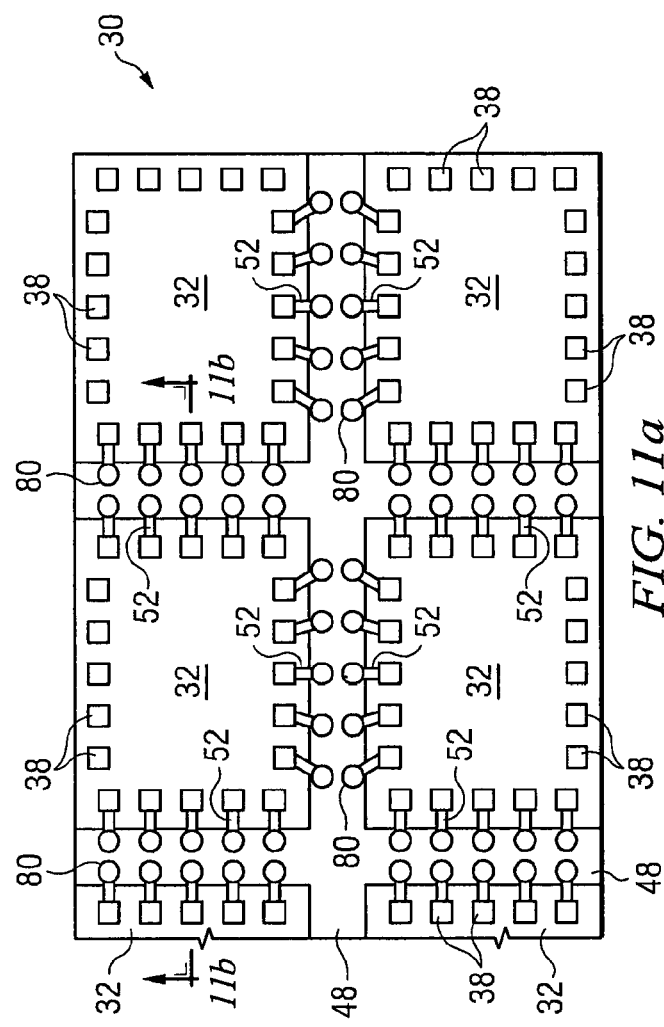
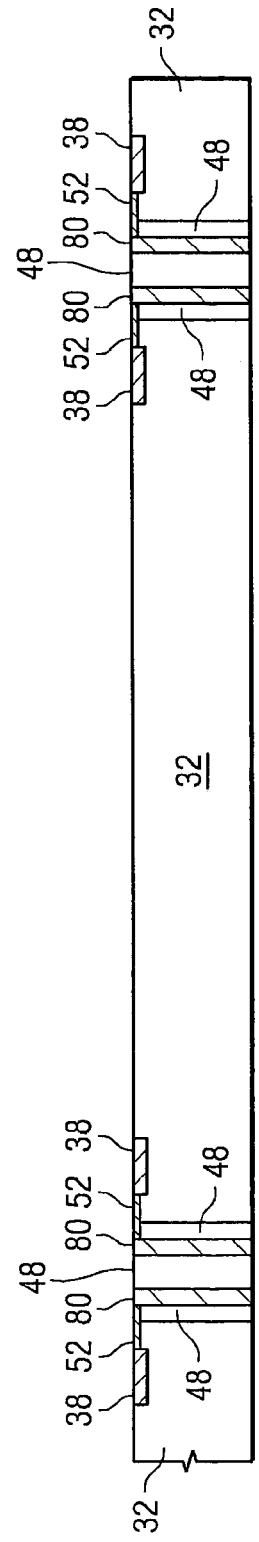

SEMICONDUCTOR PACKAGE HAVING THROUGH-HOLE VIA ON SAW STREETS FORMED WITH PARTIAL SAW

CLAIM TO DOMESTIC PRIORITY

The present invention is a continuation-in-part application of U.S. patent application Ser. No. 11/768,844, entitled "Package on Package Using Through-Hole Via Die on Saw Streets" and filed Jun. 26, 2007, which is a continuation-in-part of U.S. patent application Ser. No. 11/744,657, "Through-Hole Via on Saw Streets" and filed May 4, 2007, and claims priority to the foregoing-parent applications pursuant to 35 U.S.C. §120.

CROSS-REFERENCE TO RELATED PATENT APPLICATIONS

The present patent application is related to copending U.S. patent application Ser. No. 11/861,244, filed Sep. 25, 2007, entitled "Semiconductor Wafer Having Through-Hole Vias on Saw Streets with Backside Redistribution Layer," and filed concurrently herewith by Byung Tai Do et al. The present patent application is further related to copending U.S. patent application Ser. No. 11/861,251, filed Sep. 25, 2007, entitled "Semiconductor Die with Through-Hole Via on Saw Streets and Through-Hole Via in Active Area of Die," and filed concurrently herewith by Byung Tai Do et al.

FIELD OF THE INVENTION

The present invention relates in general to semiconductor packaging and, more particularly, to a stackable semiconductor package having through-hole vias formed along saw streets using a partial saw process.

BACKGROUND OF THE INVENTION

Semiconductor devices are found in many products used in modern society. Semiconductors find applications in consumer items such as entertainment, communications, networks, computers, and household items markets. In the industrial or commercial market, semiconductors are found in military, aviation, automotive, industrial controllers, and office equipment.

The manufacture of semiconductor devices involves formation of a wafer having a plurality of die. Each die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

Semiconductor manufacturers are increasingly adopting packaging techniques which involve three-dimensional (3D) interconnects between the semiconductor devices. The 3D interconnects provide advantages such as size reduction, reduced interconnect length, and integration of devices with different functionality into an overall 3D package. One way of implementing 3D interconnects involves the use of through-hole vias (THV). THVs are typically located around the perimeter of the die along its saw street guides.

Most, if not all, semiconductor packages using THVs require dicing tape or other wafer support material to hold the die in place during formation of the THVs. The dicing tape is applied to the backside of the wafer. The wafers are singulated through the saw streets, but not through the dicing tape which holds the die together. The THVs are then formed in the saw streets of the wafer. Unfortunately, the dicing tape adds manufacturing steps and cost to the wafer fabrication process.

A need exists to form THV along saw street guides of a semiconductor wafer without using dicing tape or other wafer support material or steps during fabrication of the THV.

SUMMARY OF THE INVENTION

In one embodiment, the present invention is a method of forming through-hole vias in a semiconductor wafer comprising the steps of forming a semiconductor wafer having a plurality of die with contact pads disposed on a surface of each die, the semiconductor wafer having saw street guides between each die, forming a trench in the saw street guides, the trench extending partially but not completely through the semiconductor wafer, the uncut portion of the saw street guides below the trench along a backside of the semiconductor wafer maintaining structural support for the semiconductor wafer, filling the trench with organic material, forming a plurality of via holes in the organic material, forming traces between the contact pads and via holes, depositing conductive material in the via holes to form metal vias, removing the uncut portion of the saw street guide below the trench along the backside of the semiconductor wafer portion, and singulating the semiconductor wafer along the saw street guides to separate the die into individual units.

In another embodiment, the present invention is a method of forming through-hole vias in a semiconductor wafer comprising the steps of forming a semiconductor wafer having a plurality of die with contact pads disposed on a surface of each die, the semiconductor wafer having saw street guides between each die, cutting a trench in the saw street guide, the trench extending only partially through the semiconductor wafer, the uncut portion of the saw street guides below the trench along a backside of the semiconductor wafer maintaining structural support for the semiconductor wafer, forming a plurality of via holes in the saw streets adjacent to the contact pads, depositing conductive material in the via holes to form metal vias, electrically connecting the metal vias to the contact pads, removing the uncut portion of the saw street guide below the trench along the backside of the semiconductor wafer portion, and singulating the semiconductor wafer along the saw street guides to separate the die.

In another embodiment, the present invention is a method of forming through-hole vias in a semiconductor wafer comprising the steps of forming a semiconductor wafer having a plurality of die with contact pads disposed on a surface of each die, the semiconductor wafer having saw street guides between each die, forming a trench in the saw street guide, the trench extending only partially through the semiconductor wafer, forming metal vias in the trenches of the saw streets, electrically connecting the metal vias to the contact pads, removing the uncut portion of the saw street guide below the trench along the backside of the semiconductor wafer portion, and singulating the semiconductor wafer along the saw street guides to separate the die.

BRIEF DESCRIPTION OF THE DRAWINGS

FIGS. 3a-3b illustrate top and side views of the saw streets filled with organic material;

FIGS. 5a-5b illustrate top and side views of forming conductive traces between the contact pads and via holes;

FIGS. 6a-6b illustrate top and side views of depositing conductive material in the via holes;

FIGS. 8a-8b illustrate top and side views of cutting the metal vias into two half-circle vias;

FIGS. 11a-11b illustrate top and side views of two side-by-side metal vias formed along the saw streets;

DETAILED DESCRIPTION OF THE DRAWINGS

Figure 1A:
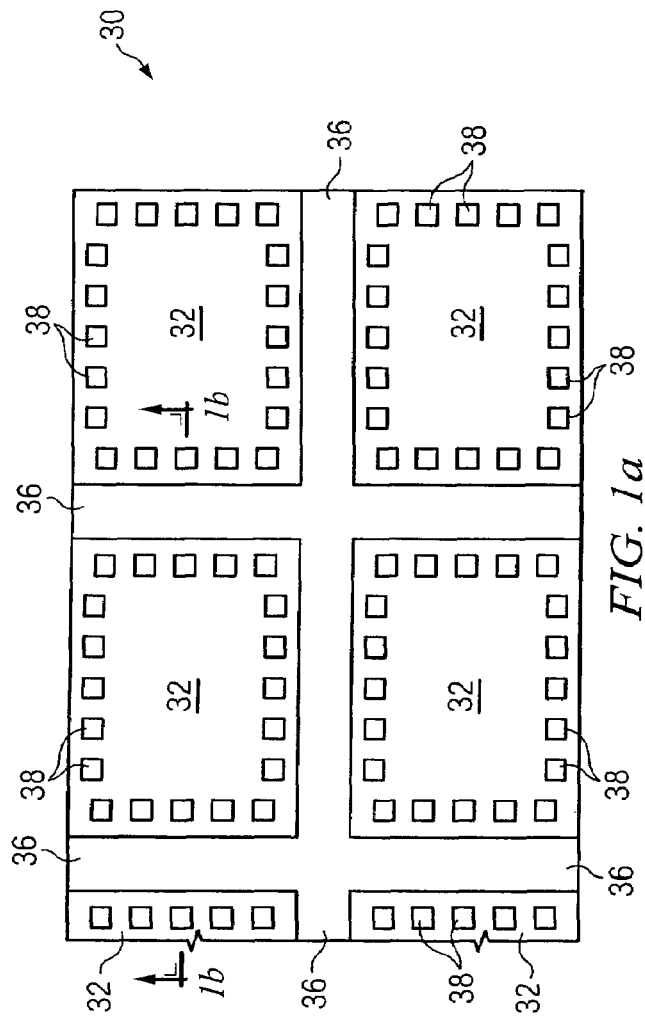
FIGS. 1a-1b illustrate top and side views of a semiconductor wafer having a plurality of die separated by saw street guides.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active front side surface having semiconductor devices disposed thereon, and a backside surface formed with bulk semiconductor material, e.g., silicon. The active front side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Patterning involves use of photolithography to mask areas of the surface and etch away undesired material to form specific structures. The doping process injects concentrations of dopant material by thermal diffusion or ion implantation. The active surface is substantially planar and uniform with electrical interconnects, such as bond pads.

Flip chip semiconductor packages and wafer level chip scale packages (WLP) are commonly used with integrated circuits (ICs) demanding high speed, high density, and greater pin count. Flip chip style packaging involves mounting an active area of the die facedown toward a chip carrier substrate or printed circuit board (PCB). The active area contains active and passive devices, conductive layers, and dielectric layers according to the electrical design of the die. The electrical and mechanical interconnect is achieved through a solder bump structure comprising a large number of individual conductive solder bumps or balls. The solder bumps are formed on the bump pads which are disposed on the active area. The bump pads connect to the active circuits by conduction tracks or traces in the active area. The solder bumps are electrically and mechanically connected to the contact pads on the carrier substrate by a solder reflow process. The flip chip semiconductor package provides a short electrical conduction path from the active devices on the die to conduction tracks on the carrier substrate in order to reduce signal propagation, lower capacitance, and achieve overall better circuit performance.

In the present discussion, a wafer level chip scale semiconductor package (WLP) is provided having through-hole vias (THV) formed along saw streets using a partial sawing process. WLP with THV formed along saw streets are described in U.S. patent application Ser. No. 11/744,657, entitled "Through-Hole Via on Saw Streets", and further in U.S. patent application Ser. No. 11/768,844, entitled "Package on Package Using Through-Hole Via Die on Saw Streets", which are incorporated herein by reference.

Turning to FIG. 1a, a semiconductor wafer 30 is shown having a plurality of die 32. In one embodiment, die 32 may have dimensions ranging from 2×2 millimeters (mm) to 15×15 mm. The die are separated by inter die wafer area 36, commonly known as saw street guides. The saw street guides are routed around the wafer such that there is a saw street on every side of each die on the wafer. Each die 32 has a plurality of contact pads 38 formed on an active side of the die. Contact pads 38 are made of aluminum, copper, or aluminum/copper alloys. Contact pads 38 electrically connect to active and passive devices through conduction tracks or layers formed on die 32. The contact pads can be disposed side-by-side a first distance from the edge of the die, as shown in FIG. 1a. Alternately, the contact pads can be offset in multiple rows such that a first row of contact pads are disposed a first distance from the edge of the die, and a second row of contact pads alternating with the first row are disposed a second distance from the edge of the die. A solder bump or wire bond will later be formed to connect to each metal contact pad for electrical and mechanical interconnect to a chip carrier substrate or printed circuit board (PCB).

Figure 1B:
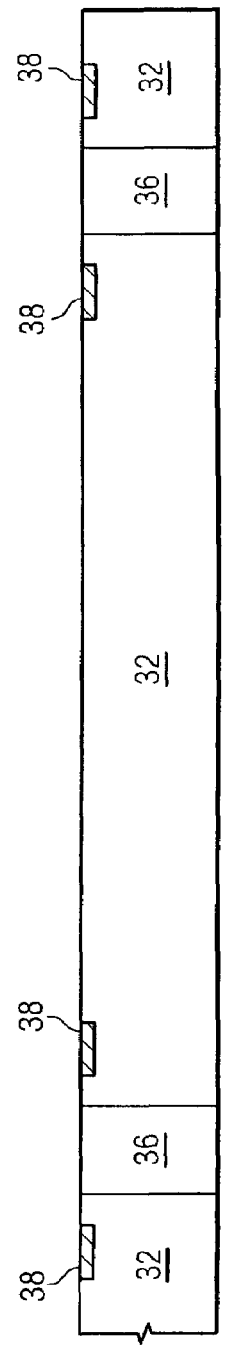

FIG. 1b is a cross-sectional view of wafer 30, taken along line 1b-1b in FIG. 1a, showing die 32 separated by saw street guides 36. The saw streets provide cutting areas to singulate the wafer into individual die. A first die 32 is disposed to the left of the leftmost saw street 36. A second die 32 is disposed between saw streets 36. A third die 32 is disposed to the right of the rightmost saw street 36. Once the wafer is singulated, each set of contact pads disposed on the respective die will provide the electrical and mechanical interconnect for that die.

Figure 2A:
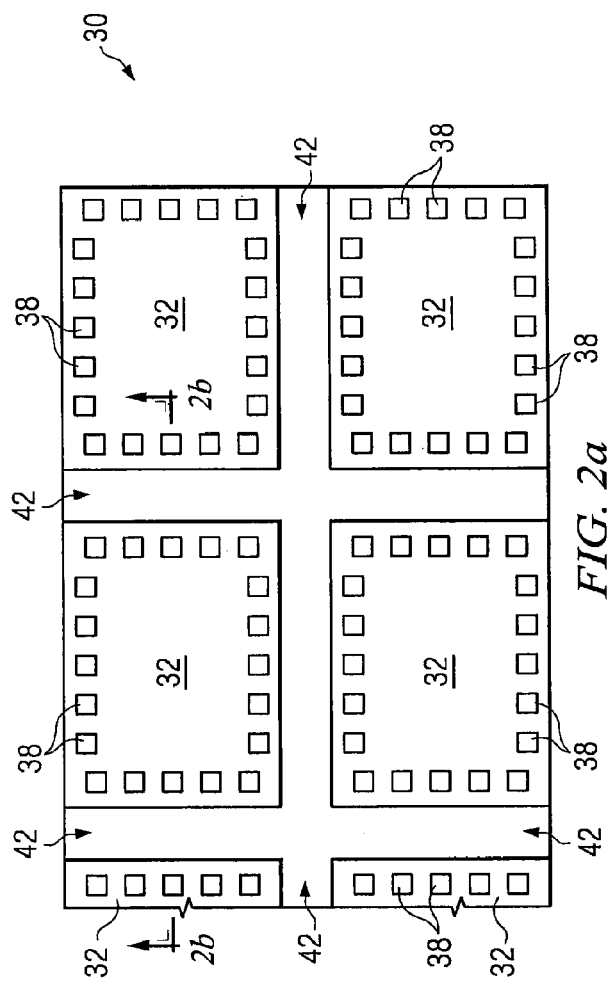
FIGS. 2a-2b illustrate top and side views of the semiconductor wafer with partially cut saw street guides.
Figure 2B:
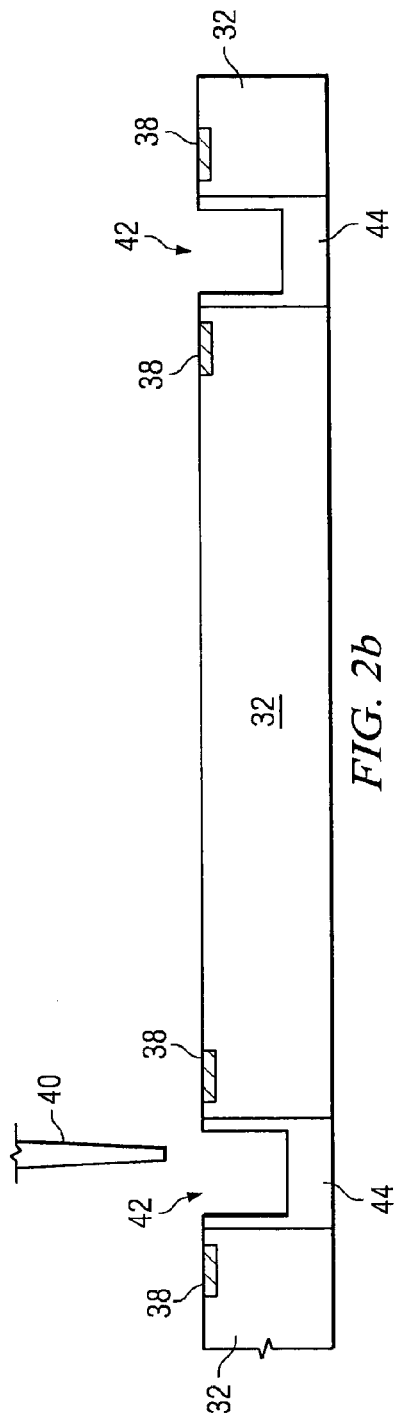

In FIG. 2a, semiconductor wafer 30 is again shown with its plurality of die 32, separated by saw street guides 36. Saw streets 36 are partially cut by cutting tool 40 as shown in FIG. 2b, which is a cross-sectional view taken along line 2b-2b in FIG. 2a. In one embodiment, cutting tool 40 can be a saw or laser. Note that the saw streets are only partially cut through, i.e., the cutting tool does not completely penetrate through thickness of wafer 30. The cutting operation removes only a top portion of the wafer material in saw street guides 36 to form a well or trench 42. For example, cutting tool 40 may cut through less than 40% of the wafer thickness, depending on the depth of via, leaving more than 60% percent of wafer material in the saw street guide in place in area 44. Trench 42 is less than a width of the channel of saw street guide 36.

It is important to note that the cutting operation does not require dicing tape or other wafer support material or step to keep the die in place because the cutting does not completely sever the wafer. The uncut portion of the wafer material in area 44 of saw street guide 36, directly under trench 42, maintains the structural support and integrity of wafer 30 for the following manufacturing operations.

In FIG. 3a, semiconductor wafer 30 is shown with its plurality of die 32, separated by partially cut saw street guides 36. Organic material 48 is deposited in trench 42 by spin-coating or needle dispensing. Organic material 48 can be benzocyclobutene (BCB), polyimide (PI), or acrylic resin. FIG. 3b is a cross-sectional view of wafer 30, taken along line 3b-3b, showing organic material 48 deposited in trench 42. Organic material 48 fills trench 42 up to the top surface of die 32.

Figure 4A:
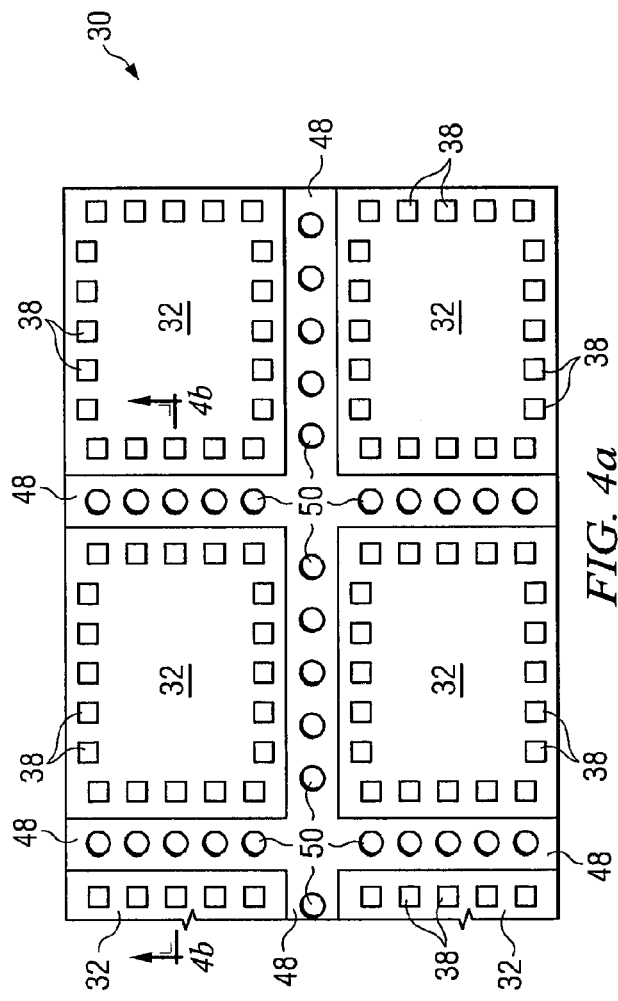
FIGS. 4a-4b illustrate top and side views of forming via holes through the organic material in the saw streets.

In FIG. 4a, semiconductor wafer 30 is shown with its plurality of die 32, separated by saw street guides 36 filled with organic material 48. A via hole 50 is cut into organic material 48 along saw streets 36. The via cutting operation uses a laser drill or etching process. Via holes 50 are placed along die 32 adjacent to contact pads 38. In one embodiment, contact pads 38 and via holes 50 have a minimum separation distance of about 20 micrometers (µm) to 150 µm, depending on the diameter and depth of the via.

Figure 4B:
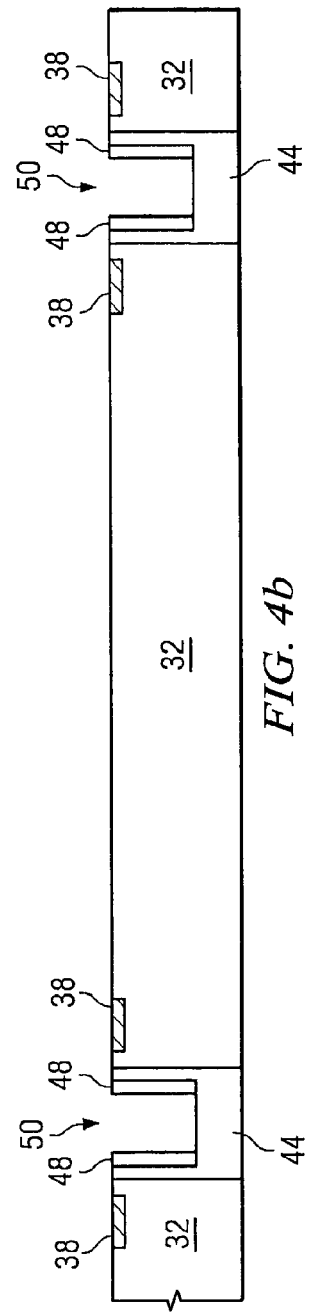

In FIG. 4b, the cross-sectional view of wafer 30, taken along line 4b-4b, shows via hole 50 cut into organic material 48 down to the wafer material in area 44. The laser drilling operation is centered about the channel of the saw street guide and makes a hole having a diameter less than the width of trench 42, which leaves a layer of organic material 48 surrounding via hole 50. The width of trench 42 is dependent on the width of saw street width, but typically smaller than the saw street width. The diameter of via hole 50 is typically about 10 µm to 100 µm, depending on the required via depth.

In FIG. 5a, semiconductor wafer 30 is shown with its plurality of die 32, separated by saw street guides 36 with via holes 50. A metal track or trace 52 is routed from each contact pad 38 to the corresponding via hole 50. Trace 52 is formed by a metal patterning process to connect contact pads 38 to via hole 50, which will be filled with conductive material in a later step. Traces 52 are provided for each contact pad and via hole pairing as shown. Some via holes 50 are dummy vias performing no electrical function. Accordingly, metal trace 52 need not be routed to every via depending on the device function. FIG. 5b is a cross-sectional view of wafer 30, taken along line 5b-5b, showing metal trace 52 connecting contact pad 38 to via hole 50.

In FIG. 6a, semiconductor wafer 30 is shown with its plurality of die 32, separated by saw street guides 36 with metal-filled vias 54. A conductive material is deposited into via hole 50 through a deposition process such as plating or plugging to form metal vias 54. The conductive material can be copper (Cu), aluminum (Al), tungsten (W), or alloys thereof, or mixtures of other conductive materials. Metal vias 54 are formed in and surrounded by organic material 48. Metal via 54 electrically connects to contact pad 38 by way of trace 52. Traces 52 are provided for each contact pad and metal via pairing as shown. FIG. 6b is a cross-sectional view of wafer 30, taken along line 6b-6b, showing metal-filled via 54 electrically connecting to contact pad 38 through trace 52. The bottom of metal via 54 coincides with the wafer material remaining in wafer area 44 of saw street guide 36.

Figure 7A:
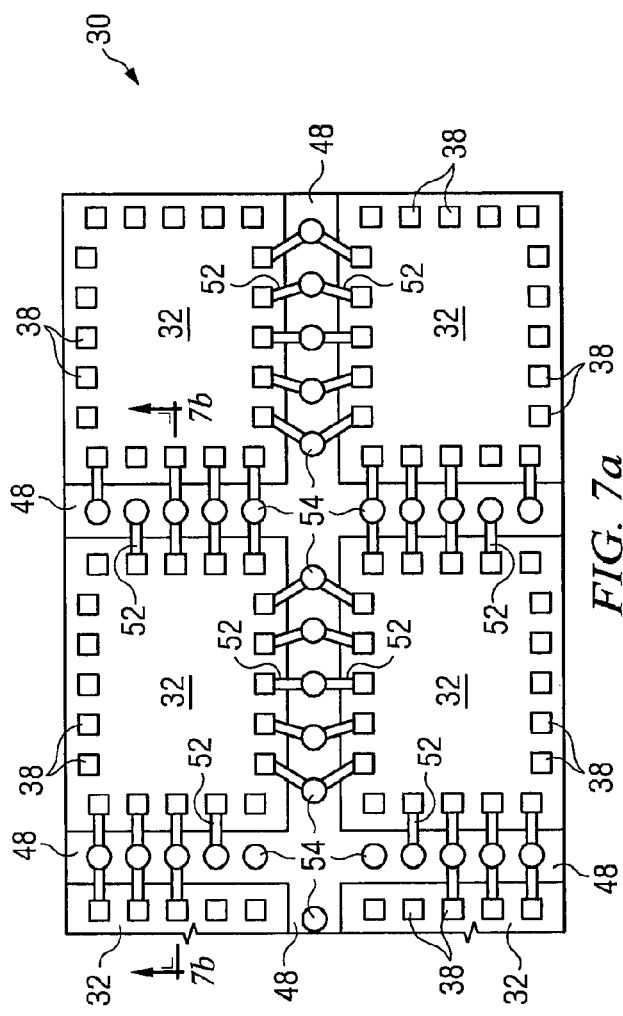
FIGS. 7a-7b illustrate top and side views of removing excess material from the backside of the semiconductor wafer.
Figure 7B:
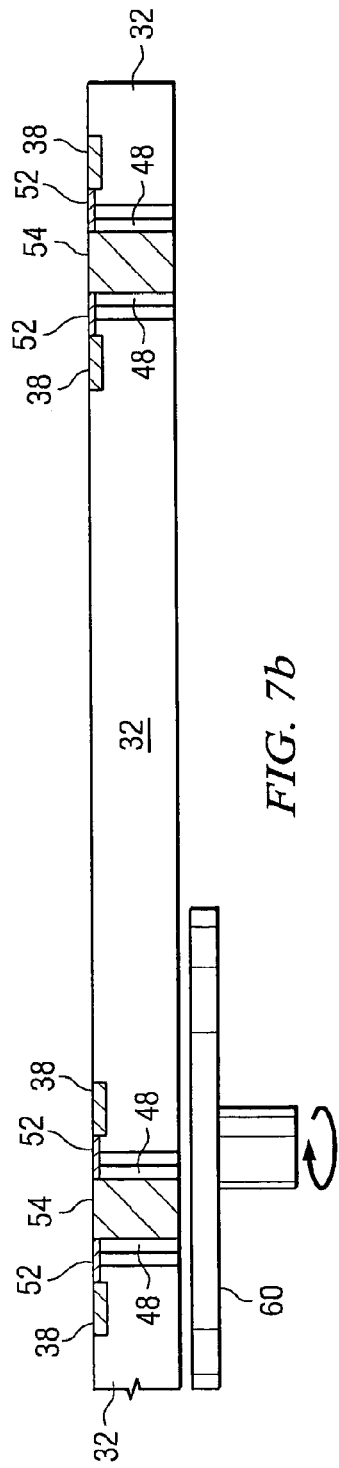

In FIG. 7a, semiconductor wafer 30 is shown with its plurality of die 32 having contact pads 38 connected to metal vias 54 by traces 52. The backside of wafer 30 is subjected to a backgrinding process by grind wheel 60 to remove the bulk semiconductor material, including wafer area 44, up to metal vias 54, as shown in FIG. 7b which is a cross-sectional view taken along line 7b-7b. Wafer area 44 which had been providing structural support during the prior operations is no longer needed and is removed by the backgrinding process. The uncut portion of the wafer material in area 44 of saw street guide 36 has maintained the structural support and integrity of wafer 30 for the previous manufacturing operations. Thus, metal vias 54 have been formed without the need for dicing tape or other wafer support material or step to keep the die in place during the previous manufacturing steps.

In FIG. 8a, semiconductor wafer 30 is shown with its plurality of die 32 having contact pads 38 connected to metal vias 56 by traces 52. Dicing tape 62 is applied to the back of semiconductor wafer 30 for structural support of the wafer during the final singulation to separate die 32, as shown in FIG. 8b which is a cross-sectional view taken along line 8b-8b. Metal vias 54 are cut through center area 68 by cutting tool 70 as shown in FIG. 8b. In one embodiment, cutting tool 70 can be a saw or laser. The cut extends down into dicing tape 62 to completely sever metal vias 54 into two equal half-circle vias 56. A pick and place operation removes die 32 as individual units from dicing tape 62.

Figure 9A:
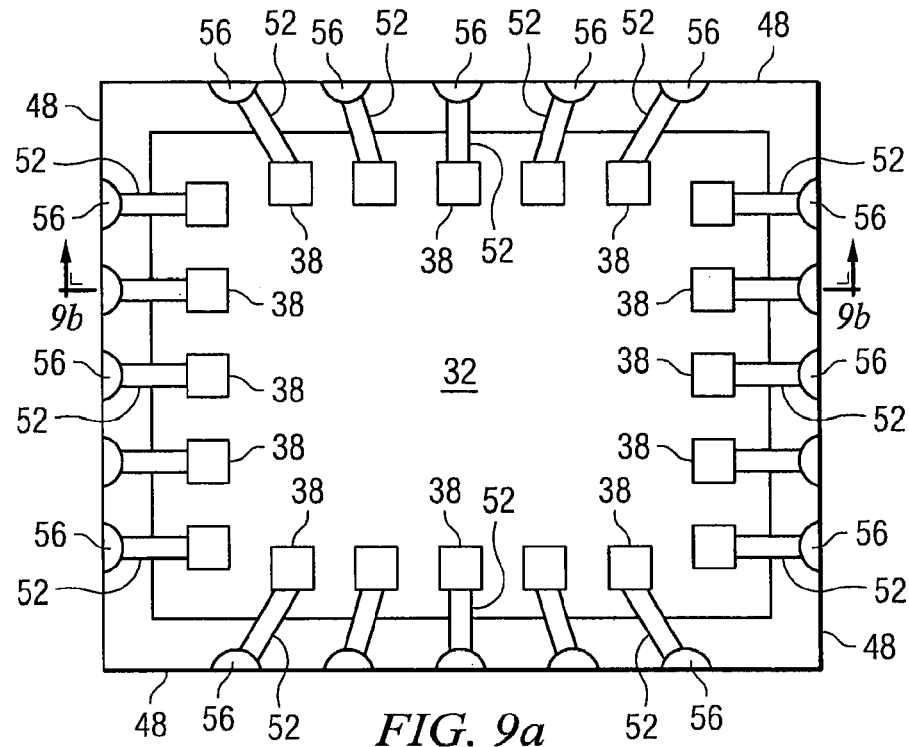
FIGS. 9a-9b illustrate top and side views of a semiconductor die with metal vias formed along the saw streets.
Figure 9B:
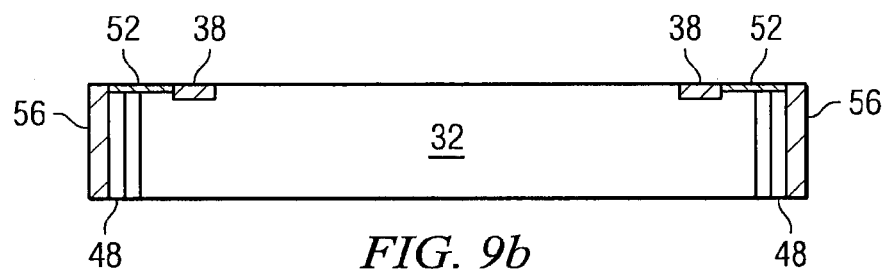

In FIG. 9a, semiconductor die 32 is shown with contact pads 38 connected to metal vias 56 by traces 52. FIG. 9b is a cross-sectional view of die 32, taken along line 9b-9b, showing a metal via on saw street configuration, as produced by the manufacturing steps of FIGS. 1-8.

Figure 10A:
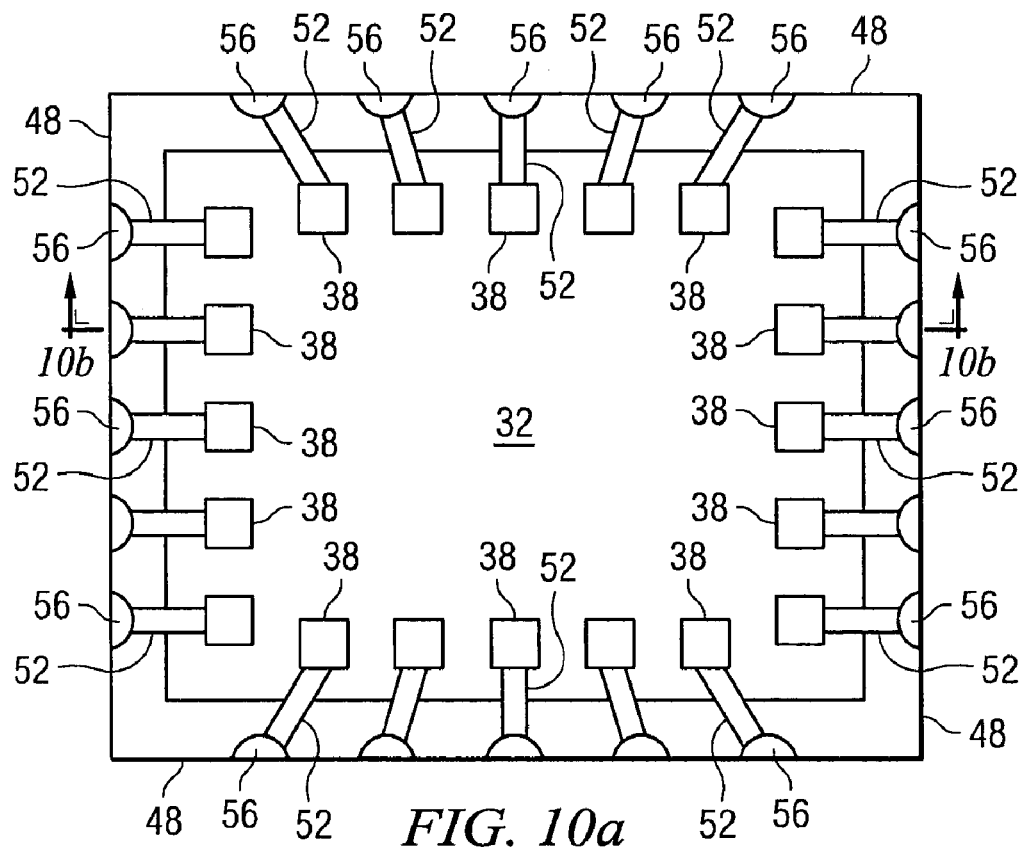
FIGS. 10a-10b illustrate top and side views of a semiconductor die with metal vias formed along the saw streets with a redistribution layer on the back side of the die.
Figure 10B:
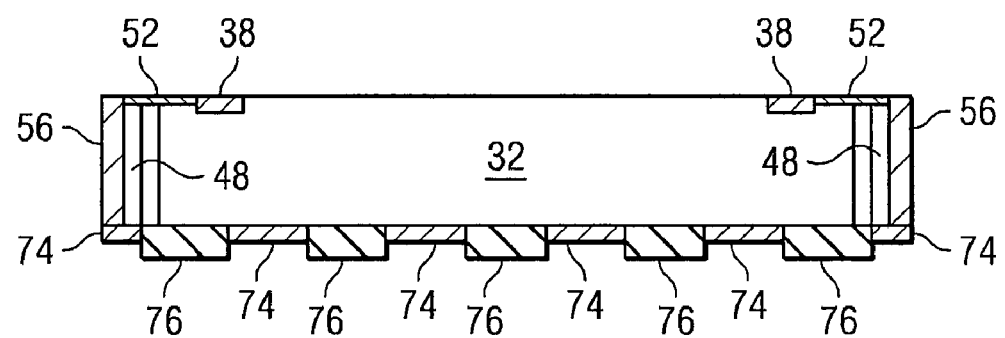

In FIG. 10a, semiconductor die 32 is shown with contact pads 38 connected to metal vias 56 by traces 52. FIG. 10b is a cross-sectional view of die 32, taken along line 10b-10b, showing a backside redistribution layer (RDL) 74. RDL 74 can be made with nickel (Ni), nickel vanadium (NiV), Cu, or Cu alloy. RDL 74 operates as an intermediate conductive layer to route electrical signals to various area of the die and provides various electrical interconnect options during package integration, such as shown in FIGS. 17-20. Repassivation layer 76 is formed between the individual nodes of backside RDL 74 for electrical isolation. The repassivation layer can be made with silicon nitride (SiN), silicon dioxide (SiO2), silicon oxynitride (SiON), polyimide, benzocyclobutene (BCB), polybenzoxazole (PBO), or other insulating material.

In FIG. 11a, semiconductor die 32 is shown with contact pads 38 connected to metal vias 80 by traces 52. FIG. 11b is a cross-sectional view of the die 32, taken along line 11b-11b, showing metal vias 80 along saw street 36. The metal vias are produced by the steps described in FIGS. 1-8, with the exception that two via holes like 50 are formed side-by-side in organic material 48. The side-by-side via holes 50 are separated by organic material 48. Conductive traces 52 connect contact pads 38 and via holes 50. The side-by-side via holes are filled with conductive material to form metal vias 80. The formation of metal vias 80 use the partial saw technique described in FIGS. 1-8.

Figure 12A:
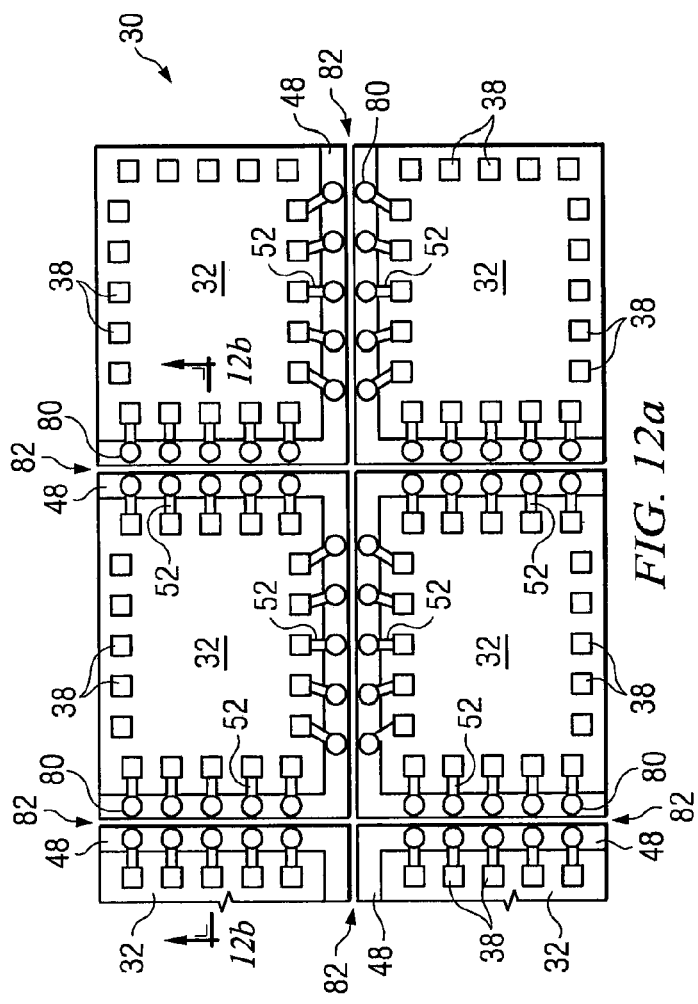
FIGS. 12a-12b illustrate top and side views of cutting the organic material between the two side-by-side metal vias to separate the die.
Figure 12B:
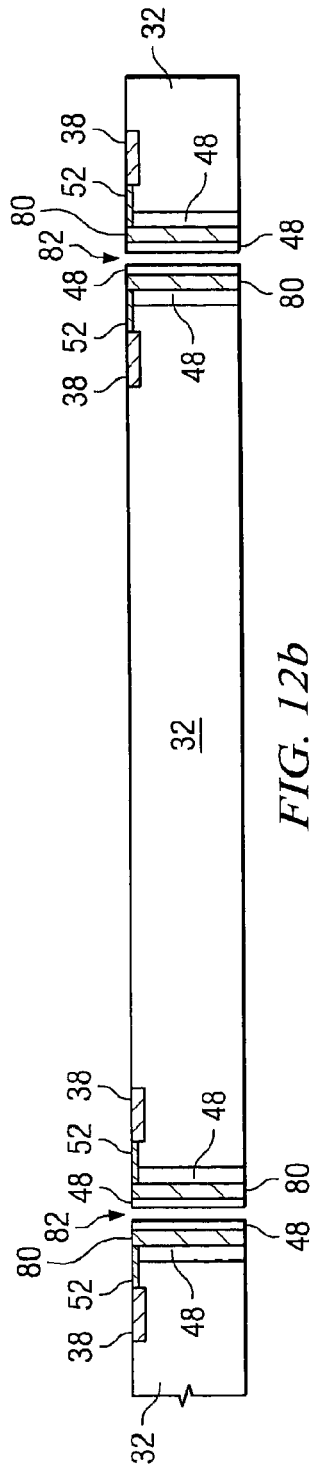

In FIG. 12a, semiconductor die 32 is shown with contact pads 38 connected to metal vias 80 by traces 52. Dicing tape is applied to the back of semiconductor wafer 30 for structural support of the wafer during the final singulation to separate die 32, as shown in FIG. 12b which is a cross-sectional view taken along line 12b-12b. The final singulation to separate the plurality of die 32 is cut through organic material 48 along line 82 between the side-by-side vias 80 with a cutting tool like 70. The singulation between the vias 80 results in the metal vias on saw street configuration.

Figure 13A:
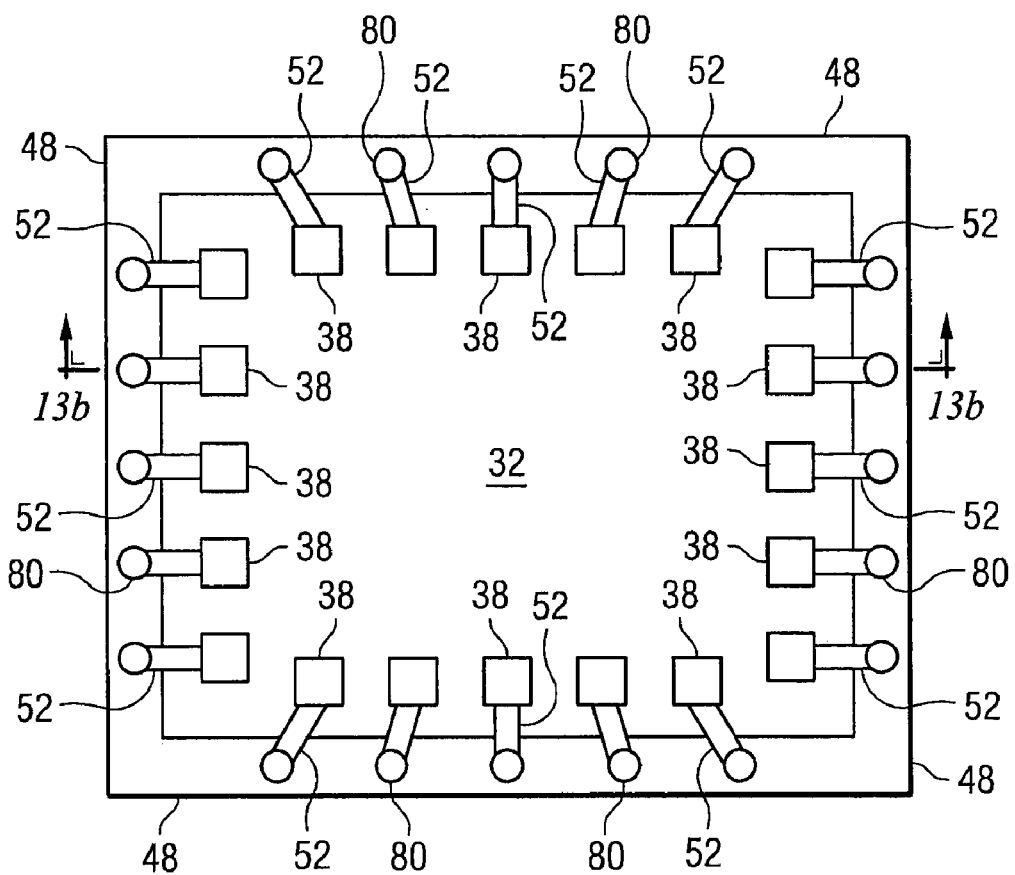
FIGS. 13a-13b illustrate top and side views of a semiconductor die with metal vias along the saw streets.
Figure 13B:
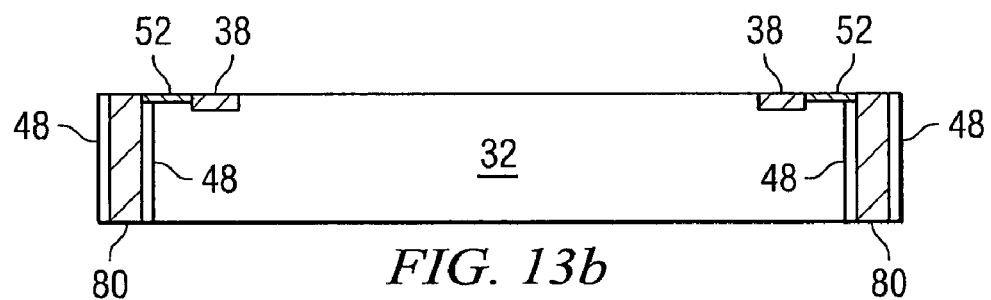

In FIG. 13a, semiconductor die 32 is shown with contact pads 38 connected to metal vias 80 by traces 52. FIG. 13b is a cross-sectional view of die 32, taken along line 13b-13b, showing metal vias on saw street configuration. The metal full-circle vias are produced by the steps described in FIGS. 1-8 and 11-12. The side-by-side via holes like 50 are separated by organic material 48. Conductive traces like 52 connect the contact pads and via holes. The side-by-side via holes are filled with conductive material to form metal vias 80. The final singulation to separate the plurality of die 32 is cut through organic material 48 between the side-by-side metal vias 80 resulting in the metal vias on saw street configuration. The formation of metal vias 80 use the partial saw technique described in FIGS. 1-8 and 11-12.

Figure 14:
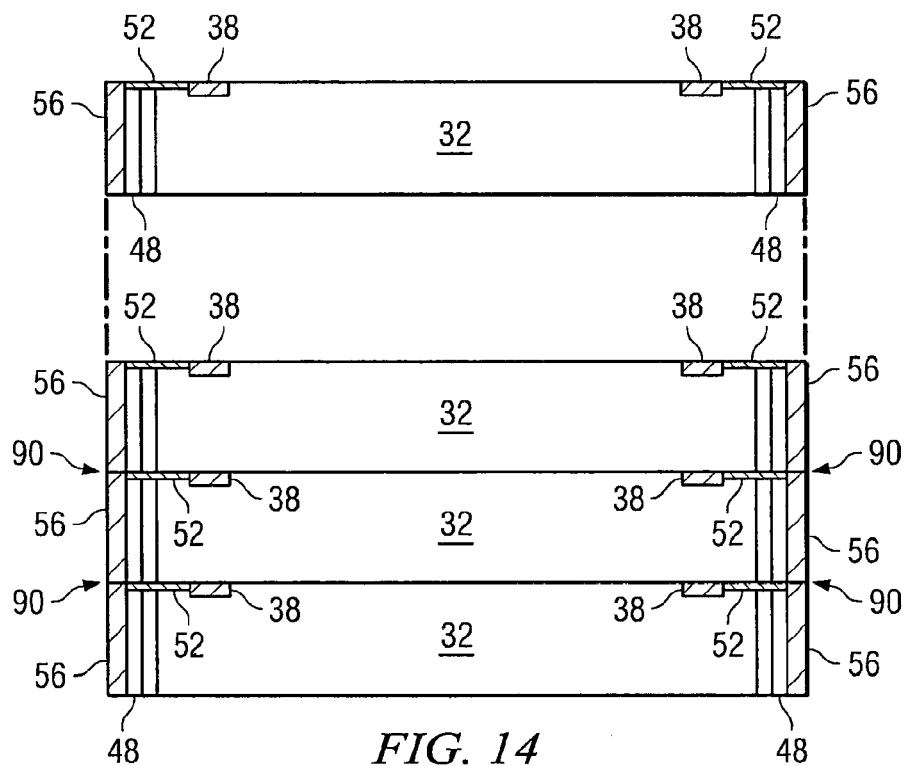
FIG. 14 illustrates die-to-die stacking using direct metal-to-metal via bonding.

FIG. 14 illustrates direct die-to-die stacking using direct via metal bonding. A plurality of die 32 is stacked as shown to suit a particular application. Each of the metal vias 56 can be joined together as shown by union 90 using a direct via metal bonding process. Alternately, semiconductor die 32 with metal vias 80 can be joined together by union 90 using a direct via metal bonding process.

Figure 15:
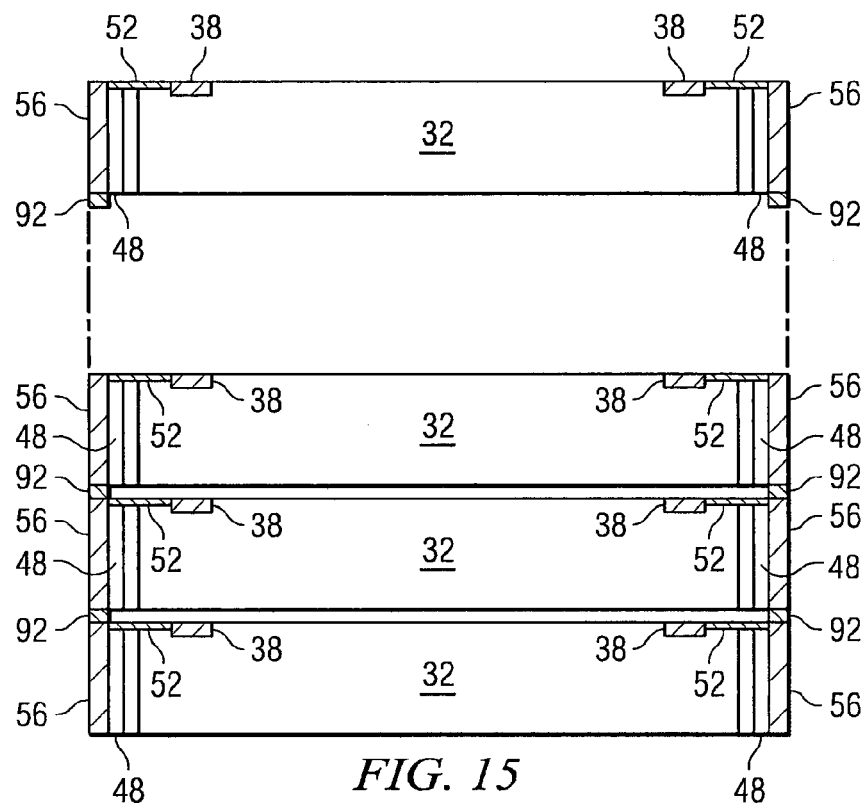
FIG. 15 illustrates die-to-die stacking using via bonding with solder paste.

FIG. 15 illustrates die-to-die stacking using via bonding with solder paste 92. A plurality of die 32 is stacked as shown to suit a particular application. Each of the metal vias 56 can be joined together as shown by reflowing solder paste 92 to create a strong metallurgical bond between each of stacked die 32. Alternately, semiconductor die 32 with metal vias 80 can be joined together by solder paste 92 using a reflow process.

Figure 16:
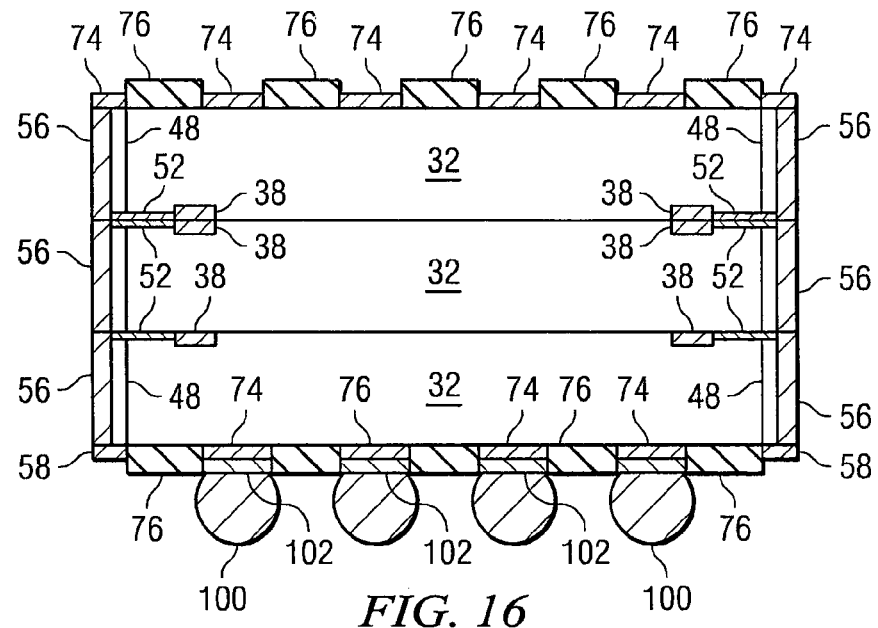
FIG. 16 illustrates an alternate packaging embodiment using die-to-die stacking.

In FIG. 16, semiconductor die 32 are stacked and connected by THV 56 or 80 on saw street 36 as described in FIGS. 14 and 15. The top semiconductor die is shown stacked in the inverted position to make use of backside RDL 74 for interconnect to other devices and packages (not shown). RDL 74 is separated and electrically isolated by repassivation layer 76. The bottom semiconductor die 32 has solder bumps 100 formed on contact pads 102 separated by repassivation layers 76. The backside RDL 74 provides intermediate interconnect from solder bumps 100 to the active surface of the bottom semiconductor die 32.

Figure 17:
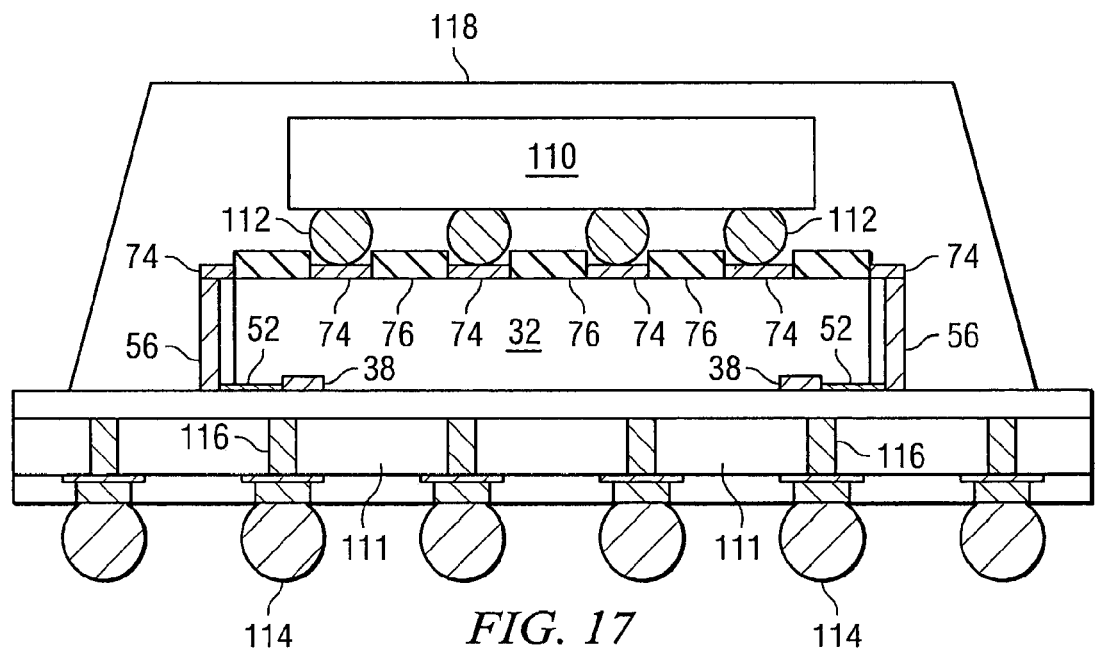
FIG. 17 illustrates the semiconductor die with metal vias connected to a second die with solder bumps.

In FIGS. 17-20 shows various packaging applications using, in part, an interconnect technique with the THVs formed on saw streets by the present partial saw process. FIG. 17 has semiconductor die 110 connecting through solder bumps 112 to backside RDL 74 on die 32. Backside RDL 74 electrically connect to active circuits on die 32, as well as providing interconnect to die 110. Die 32 is supported by substrate 111. Contact pads 38 and/or metal vias 56 or 80 electrically connect to solder bumps 114 through conductive layer 116. The packages are sealed by epoxy encapsulant 118.

Figure 18:
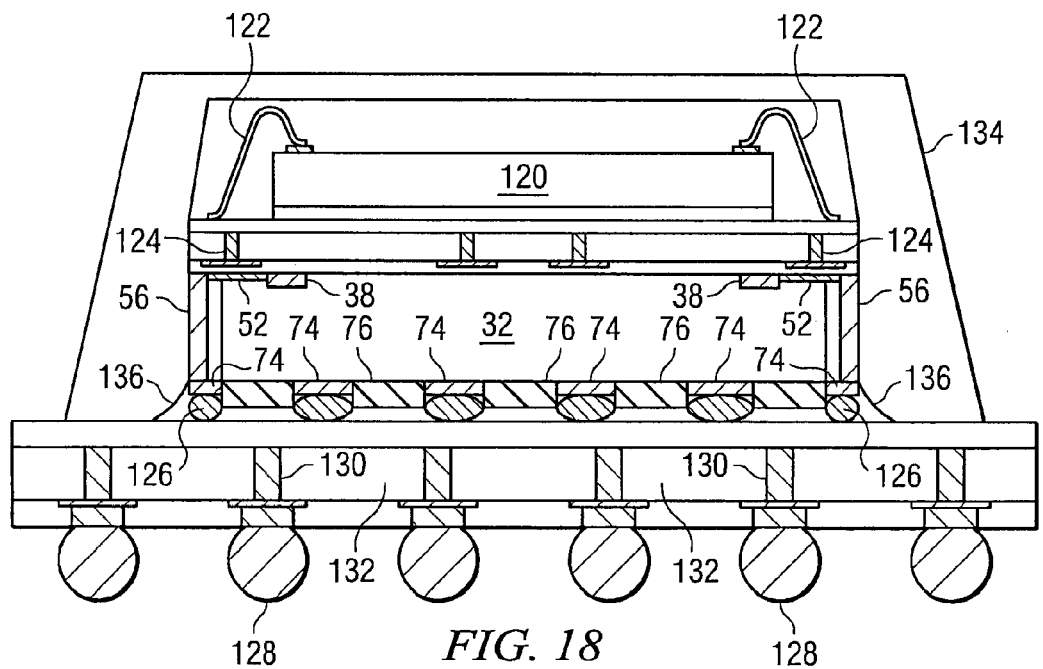
FIG. 18 illustrates the semiconductor die with metal vias connected to a second die with bond wires.

FIG. 18 shows semiconductor die 120 electrically connected to contact pad 38 and metal vias 56 or 80 through bond wires 122 and conductive layer 124. Backside RDL 74 electrically connects to active circuits on die 32 and solder bumps 126, which in turn electrically connect to solder bumps 128 through conductive layer 130. Die 32 is supported by substrate 132. The packages are sealed by epoxy encapsulant 134. An underfill material 136 can be used for stress relief.

Figure 19:
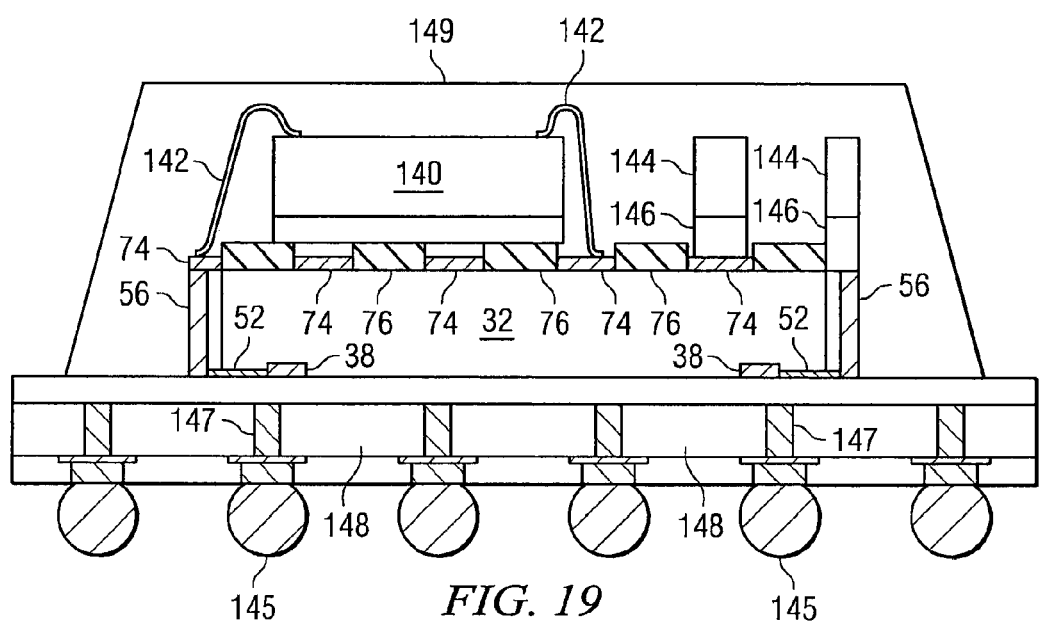
FIG. 19 illustrates the semiconductor die with metal vias connected to a second die with bond wires and to passive devices with solder paste.

FIG. 19 shows semiconductor die 140 electrically connected through bond wires 142 to backside RDL 74 of semiconductor die 32. Backside RDL 74 electrically connect to active circuits on die 32, as well as providing interconnect to die 140. Passive devices 144 also connect to backside RDL 74 with solder paste 146. Metal vias 56 electrically connect to solder bumps 145 through conductive layer 147. Die 32 is supported by substrate 148. The packages are sealed by epoxy encapsulant 149.

Figure 20:
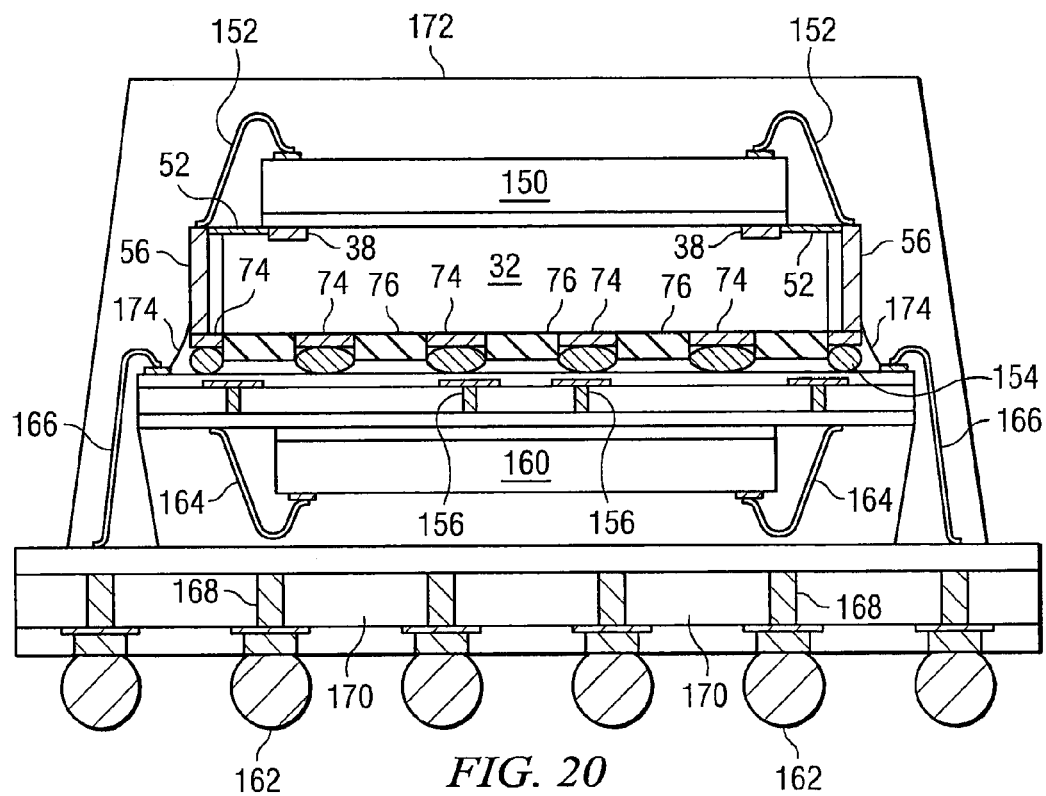
FIG. 20 illustrates the semiconductor die with metal vias connected to other die with solder bumps and wire bonds.

FIG. 20 shows semiconductor die 150 electrically connected to metal vias 56 or 80 by way of bond wires 152. Solder bumps 154 electrically connect backside RDL 74 to conductive layer 156, which connects semiconductor die 160 with solder bumps 162 by way of bond wires 164, bond wires 166, and conductive layer 168. Die 32 is supported by substrate 170. The packages are encased by epoxy encapsulant 172. An underfill material 174 can be used for stress relief.

While one or more embodiments of the present invention have been illustrated in detail, the skilled artisan will appreciate that modifications and adaptations to those embodiments may be made without departing from the scope of the present invention as set forth in the following claims

What is claimed:

1. A method of forming through-hole vias in a semiconductor wafer, comprising:
    forming a semiconductor wafer having a plurality of die with contact pads disposed on a surface of each die, the semiconductor wafer having saw street guides between each die;
    forming a trench in the saw street guides without using support material to support the semiconductor wafer, the trench extending partially but not completely through the semiconductor wafer, the uncut portion of the saw street guides below the trench along a backside of the semiconductor wafer being more than 60% of a thickness of the semiconductor wafer to maintain structural support for the semiconductor wafer without the support material during the processing steps of:
        (a) filling the trench with organic material,
        (b) forming a plurality of via holes in the organic material,
        (c) forming traces between the contact pads and via holes, and
        (d) depositing conductive material in the via holes to form metal vias;
    removing the uncut portion of the saw street guide below the trench along the backside of the semiconductor wafer portion;
    applying dicing tape to the backside of the semiconductor wafer;
    cutting through the metal vias to the dicing tape; and
    singulating the semiconductor wafer along the saw street guides by removing the dicing tape to separate the die into individual units.

2. The method of claim 1, wherein at least one metal via is formed between the contact pads on adjacent die.

3. The method of claim 2, wherein the semiconductor wafer is singulated through the at least one metal via to form metal vias electrically connected to the contact pads by the traces.

4. The method of claim 1, wherein two metal vias are formed side by side between the contact pads on adjacent die.

5. The method of claim 4, wherein the semiconductor wafer is singulated along the saw street guides between the two metal vias to form metal vias electrically connected to the contact pads by the traces.

6. The method of claim 1, wherein the trench is less than a width of the saw street guides.

7. The method of claim 1, wherein the trench is centered about the saw street guides.

8. The method of claim 1, wherein the die are stackable and connected by the metal vias when stacked.

9. A method of forming through-hole vias in a semiconductor wafer, comprising:
    forming a semiconductor wafer having a plurality of die with contact pads disposed on a surface of each die, the semiconductor wafer having saw street guides between each die;
    forming a trench in the saw street guides without using support material to support the semiconductor wafer, the trench extending partially through the semiconductor wafer, the uncut portion of the saw street guides below the trench along a backside of the semiconductor wafer having sufficient thickness to maintain structural support for the semiconductor wafer without the support material during the processing steps of:
        (a) filling the trench with organic material,
        (b) forming a plurality of via holes in the organic material,
        (c) forming traces between the contact pads and via holes, and
        (d) depositing conductive material in the via holes to form metal vias;
    removing the uncut portion of the saw street guide below the trench along the backside of the semiconductor wafer portion;
    applying wafer support material to the backside of the semiconductor wafer;
    cutting through the metal vias to the wafer support material; and
    singulating the semiconductor wafer along the saw street guides by removing the wafer support material to separate the die into individual units.

10. The method of claim 9, wherein at least one metal via is formed between the contact pads on adjacent die.

11. The method of claim 10, wherein the semiconductor wafer is singulated through the at least one metal via to form metal vias electrically connected to the contact pads by the traces.

12. The method of claim 9, wherein two metal vias are formed side by side between the contact pads on adjacent die.

13. The method of claim 12, wherein the semiconductor wafer is singulated along the saw street guides between the two metal vias to form metal vias electrically connected to the contact pads by the traces.

14. The method of claim 9, wherein the trench is less than a width of the saw street guides.

15. The method of claim 9, wherein the trench is centered about the saw street guides.

16. The method of claim 9, wherein the die are stackable and connected by the metal vias when stacked.

17. The method of claim 9, wherein the uncut portion of the saw street guides below the trench along the backside of the semiconductor wafer being more than 60% of a thickness of the semiconductor wafer.

18. A method of forming through-hole vias in a semiconductor wafer, comprising:
    forming a semiconductor wafer having a plurality of die with contact pads disposed on a surface of each die, the semiconductor wafer having saw Street guides between each die;
    forming a trench in the saw street guides without using support material to support the semiconductor wafer, the trench extending partially through the semiconductor wafer, the uncut portion of the saw street guides below the trench along a backside of the semiconductor wafer having sufficient thickness to maintain structural support for the semiconductor wafer without the support material during the processing steps of:
        (a) filling the trench with organic material,
        (b) forming a plurality of via holes in the organic material,
        (c) depositing conductive material in the via holes to form conductive vias, and
        (d) forming conductive traces between the contact pads and conductive vias;
    removing the uncut portion of the saw street guide below the trench along the backside of the semiconductor wafer portion; and
    singulating the semiconductor wafer along the saw street guides to separate the die into individual units.

19. The method of claim 18, wherein at least one conductive via is formed between the contact pads on adjacent die.

20. The method of claim 19, wherein the semiconductor wafer is singulated through the at least one conductive via to form conductive vias electrically connected to the contact pads by the conductive traces.

21. The method of claim 18, wherein two conductive vias are formed side by side between the contact pads on adjacent die.

22. The method of claim 21, wherein the semiconductor wafer is singulated along the saw street guides between the two conductive vias to form conductive vias electrically connected to the contact pads by the conductive traces.

23. The method of claim 18, wherein the trench is less than a width of the saw street guides.

24. The method of claim 18, wherein the trench is centered about the saw street guides.

25. The method of claim 18, wherein the die are stackable and connected by the conductive vias when stacked.

26. The method of claim 18, wherein the uncut portion of the saw street guides below the trench along the backside of the semiconductor wafer being more than 60% of a thickness of the semiconductor wafer.

* * * * *